(12) United States Patent
Rashed et al.

(10) Patent No.: US 8,789,000 B1
(45) Date of Patent: Jul. 22, 2014

(54) VARIABLE POWER RAIL DESIGN

(71) Applicant: GLOBALFOUNDRIES Inc., Grand Cayman (KY)

(72) Inventors: Mahbub Rashed, Cupertino, CA (US); Lei Yuan, Cupertino, CA (US); Jongwook Kye, Pleasanton, CA (US); Suresh Venkatesan, Saratoga Springs, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/863,591

(22) Filed: Apr. 16, 2013

(51) Int. Cl.
*G06F 17/50* (2006.01)

(52) U.S. Cl.
USPC ............................ 716/127; 716/119; 716/120

(58) Field of Classification Search
USPC .......................................... 716/119, 120, 127
See application file for complete search history.

(56) References Cited

U.S. PATENT DOCUMENTS

| | | | |
|---|---|---|---|
| 7,055,121 B1* | 5/2006 | Bolander et al. ............... | 716/113 |
| 2002/0069396 A1* | 6/2002 | Bhattacharya et al. ........... | 716/7 |
| 2010/0115484 A1* | 5/2010 | Frederick ........................ | 716/10 |
| 2013/0042216 A1* | 2/2013 | Loh et al. ....................... | 716/119 |
| 2013/0326438 A1* | 12/2013 | LEE et al. ....................... | 716/55 |
| 2014/0075401 A1* | 3/2014 | Seningen et al. ............. | 716/106 |

\* cited by examiner

*Primary Examiner* — Suresh Memula
(74) *Attorney, Agent, or Firm* — Darrell L. Pogue; Keohane & D'Alessandro PLLC (57) ABSTRACT

A system and design methodology for performing routing in an integrated circuit design is disclosed. An integrated circuit design is first created using standard cells having metal level 2 (M2) power rails. Routing is performed and power rail current density for the integrated circuit is computed. Standard cells that have power rail current density below a predetermined threshold are replaced with a functionally equivalent standard cell that does not have M2 power rails, and the routing operation is performed again, until the design converges.

20 Claims, 10 Drawing Sheets

VARIABLE POWER RAIL DESIGN

FIELD OF THE INVENTION

The present invention relates generally to integrated circuit design and, more particularly to improvements in routing for integrated circuit design.

BACKGROUND

As the trend in semiconductors continues towards reduced critical dimensions, integrated circuits involving millions of transistors on a single chip have become commonplace. Due to the large number of devices on a single chip, an entire industry has evolved specifically to supply the semiconductor industry with software and hardware tools to automate much of the process of integrated circuit design.

Design automation tools are computer-based tools that assist through automation of procedures that would otherwise be performed manually. Simulation of proposed design functionality and synthesis of integrated circuit logic and layout are two examples.

An integrated circuit may implement logic functions that are a combination of various standard cells. A crucial step in completing the circuit design is typically a global routing step, which is an attempt to logically determine a path for each interconnection between cells in the entire design. Routing decisions are made based on the available avenues formed by the current placement of circuit elements and/or blocks, and are assigned in consideration of various costs, also referred to herein as constraints (e.g., to incur the shortest total length of interconnect lines between the connectors). Once the global router has assigned the general flow of interconnect lines, a detailed router attempts to make the interconnect lines fit the assignments made by the global router.

As more complicated designs are developed to achieve higher performance and higher reliability as well as efficient chip scaling, the demands placed on routing tools increase. It is therefore desirable to have improvements in routing for integrated circuit design.

SUMMARY OF THE INVENTION

A first aspect of the present invention provides a method for designing an integrated circuit, comprising: obtaining a first standard cell library; obtaining a second standard cell library, wherein the first standard cell library and second standard cell library are logically equivalent, and wherein one of the first standard cell library and second standard cell library are of an M2PR type and another of the first standard cell library and second standard cell library are of an M2PRE type; placing cells from the first standard cell library in an integrated circuit design embodiment; performing a first routing using the placed cells from the first standard cell library; identifying standard cells for replacement; replacing the identified standard cells with standard cells from the second standard cell library; and performing a second routing using the placed cells from both the first standard cell library and second standard cell library.

A second aspect of the present invention provides a system for designing an integrated circuit, comprising one or more processors coupled to non-transitory memory containing machine instructions, that when executed by the one or more processors, perform the functions of: obtaining a first standard cell library; obtaining a second standard cell library, wherein the first standard cell library and second standard cell library are logically equivalent, and wherein one of the first standard cell library and second standard cell library are of an M2PR type and another of the first standard cell library and second standard cell library are of an M2PRE type; placing cells from the first standard cell library in an integrated circuit design embodiment; performing a first routing using the placed cells from the first standard cell library; identifying standard cells for replacement; replacing the identified standard cells with standard cells from the second standard cell library; and performing a second routing using the placed cells from both the first standard cell library and second standard cell library.

A third aspect of the present invention provides a computer program product embodied in a non-transitory computer-readable medium for designing an integrated circuit, comprising: instructions for obtaining a first standard cell library; instructions for obtaining a second standard cell library, wherein the first standard cell library and second standard cell library are logically equivalent, and wherein one of the first standard cell library and second standard cell library are of an M2PR type and another of the first standard cell library and second standard cell library are of an M2PRE type; instructions for placing cells from the first standard cell library in an integrated circuit design embodiment; instructions for performing a first routing using the placed cells from the first standard cell library; instructions for identifying standard cells for replacement; instructions for replacing the identified cells with cells from the second cell library; and instructions for performing a second routing using the placed cells from both the first standard cell library and second standard cell library.

BRIEF DESCRIPTION OF THE DRAWINGS

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity. Furthermore, for clarity, some reference numbers may be omitted in certain drawings.

Features of this invention will be more readily understood from the following detailed description of the various aspects of the invention taken in conjunction with the accompanying drawings in which.

DETAILED DESCRIPTION

Exemplary embodiments will now be described more fully herein with reference to the accompanying drawings, in which exemplary embodiments are shown. Exemplary embodiments of the present invention provide a design methodology that improves routing for an integrated circuit design. In some embodiments, an integrated circuit design is first created using standard cells having metal level 2 (M2) power rails. Routing is performed and power rail current density for the integrated circuit is computed. Standard cells that have power rail current density below a predetermined threshold are replaced with a functionally equivalent standard cell that does not have M2 power rails, and the routing operation is performed again. Since the cells with low power requirements are replaced with cells having no M2 power rails, the router now has more flexibility and freedom in selecting routing options, which can lead to improved routes for the integrated circuit design.

It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure (e.g., a first layer), is present on a second element, such as a second structure (e.g. a second layer), wherein intervening elements, such as an interface structure (e.g. interface layer), may be present between the first element and the second element.

Figure 1:
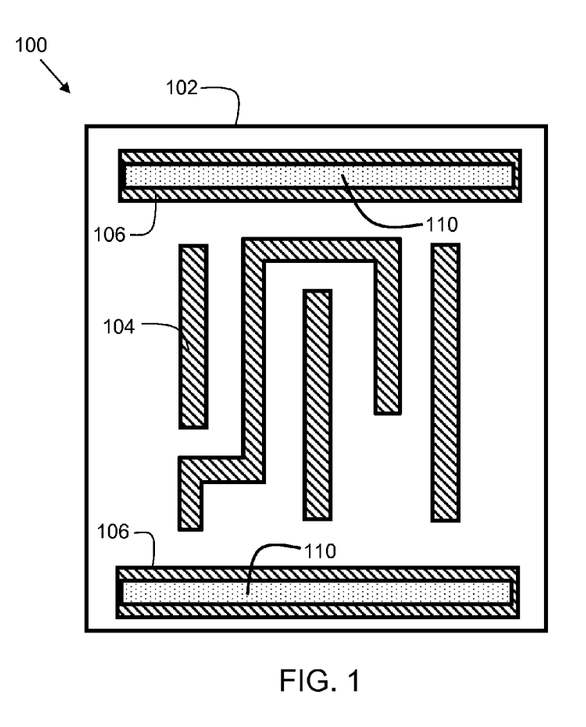
FIG. 1 shows a standard cell with M2 power rails in accordance with illustrative embodiments.

FIG. 1 shows a standard cell 100 with M2 power rails in accordance with illustrative embodiments. Standard cell 100 includes a region 102. Within region 102 are a plurality of metal level 1 (M1) lines 104 that connect various transistors (not shown) to form logic functions, such as NAND, NOR, XOR, and the like. M1 power rails 106 provide power to the standard cell 100. M2 power rails 110 provide additional power, but occupy M2 real estate that cannot be used for other routing functions.

Figure 2:
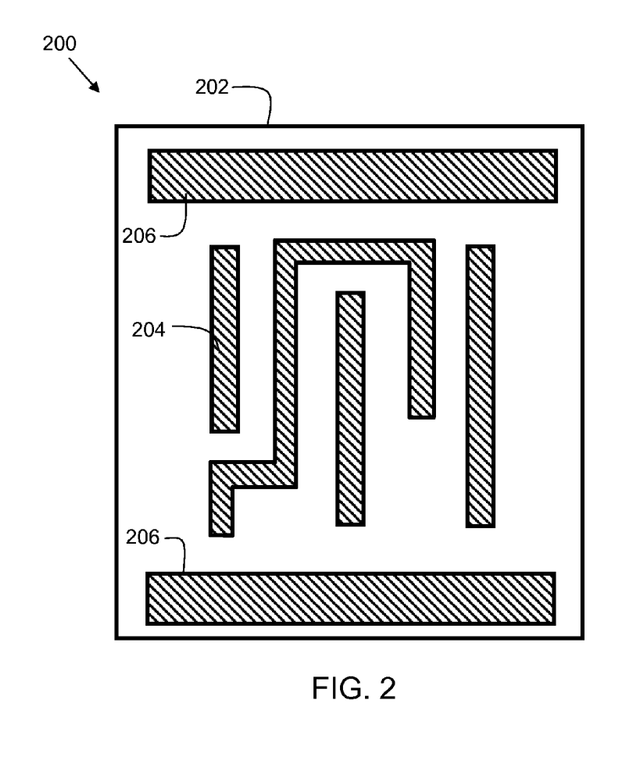
FIG. 2 shows a standard cell without M2 power rails in accordance with illustrative embodiments.

FIG. 2 shows a standard cell 200 without M2 power rails in accordance with illustrative embodiments. Standard cell 200 includes a region 202. Within region 202 are a plurality of metal level 1 (M1) lines 204 that connect various transistors (not shown) to form logic functions, such as NAND, NOR, XOR, and the like. M1 power rails 206 provide power to the standard cell 200. Standard cell 200 is functionally equivalent to standard cell 100 of FIG. 1, but without the M2 power rails (see 110 of FIG. 1).

Figure 3A:
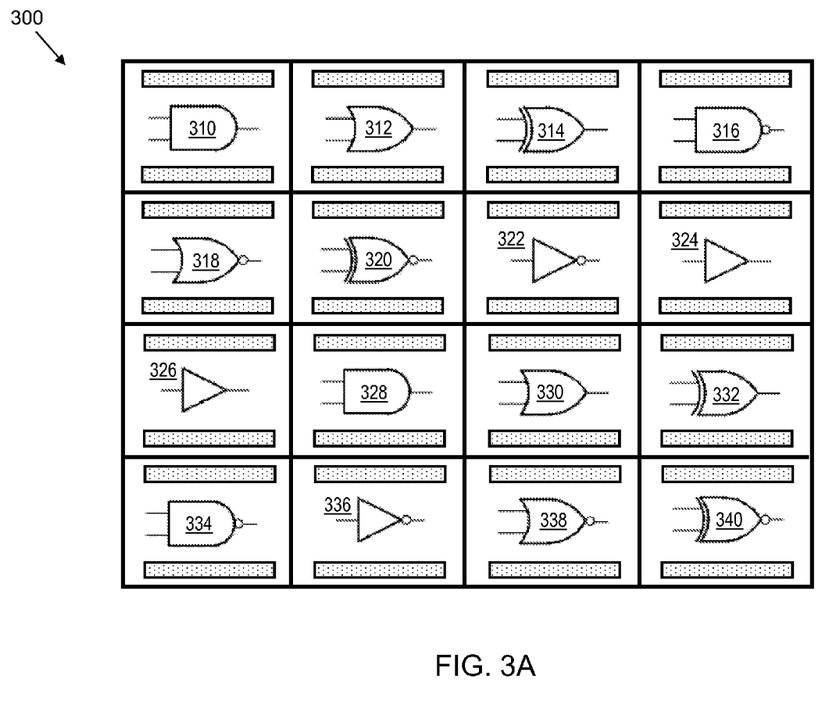
FIG. 3A is a representation of an integrated circuit with standard cells having M2 power rails in accordance with illustrative embodiments.

FIG. 3A is a representation of an integrated circuit 300 with standard cells having M2 power rails (M2PR). A plurality of standard cells is shown. Cell 310 represents an AND gate M2PR standard cell. Cell 312 represents an OR gate M2PR standard cell. Cell 314 represents an XOR gate M2PR standard cell. Cell 316 represents a NAND gate M2PR standard cell. Cell 318 represents a NOR gate M2PR standard cell. Cell 320 represents an XNOR gate M2PR standard cell. Cell 322 represents a NOT gate M2PR standard cell. Cell 324 and cell 326 each represent a buffer gate M2PR standard cell. Cell 328 represents an AND gate M2PR standard cell. Cell 330 represents an OR gate M2PR standard cell. Cell 332 represents an XOR gate M2PR standard cell. Cell 334 represents a NAND gate M2PR standard cell. Cell 336 represents a NOT gate M2PR standard cell. Cell 338 represents a NOR gate M2PR standard cell. Cell 340 represents an XNOR gate M2PR standard cell.

Figure 3B:
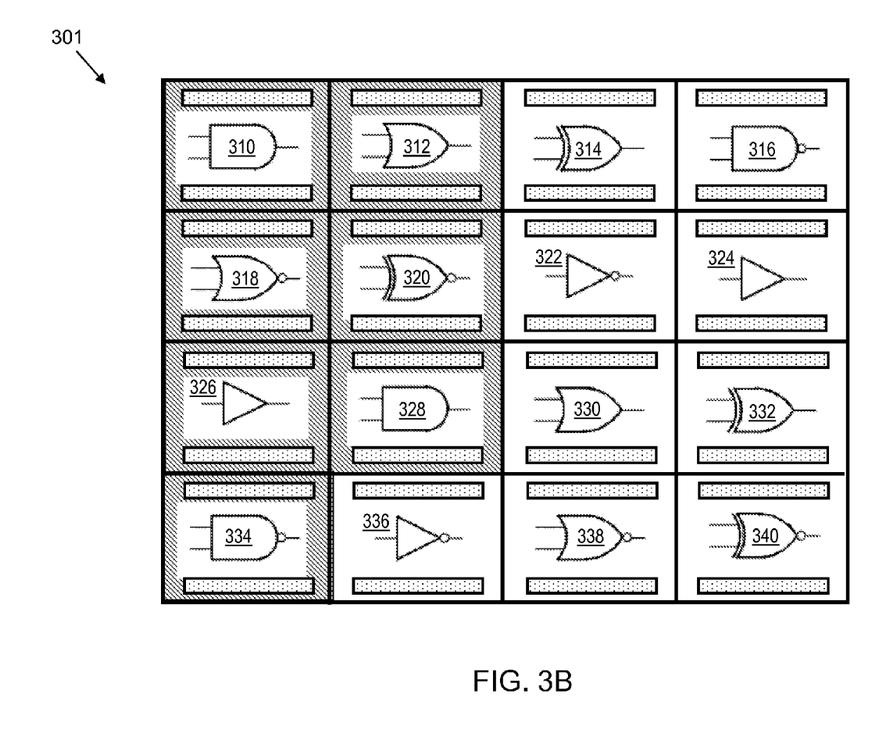
FIG. 3B is a representation of an integrated circuit with standard cells identified as low current density cells in accordance with illustrative embodiments.

FIG. 3B is a representation of integrated circuit 301 with standard cells identified as low current density on the power rails in accordance with illustrative embodiments. As shown, cells 310, 312, 318, 320, 326, 328, and 334 are identified as having current density on the power rails below a predetermined threshold. In some embodiments the predetermined threshold value ranges from about $5 \times 10^6$ amperes per square centimeter ($A/cm^2$) to about $1 \times 10^7$ ($A/cm^2$). In that case, standard cells that consume less than $5 \times 10^6$ amperes per square centimeter ($A/cm^2$) during operation are considered to be low current density standard cells. The computation of power rail current density may be an estimate, or an analysis that may be performed with an EDA tool or utility such as HSPICE or Prime Power, for example. In some embodiments, the vendor of the standard cell design may provide the current density specifications.

Figure 3C:
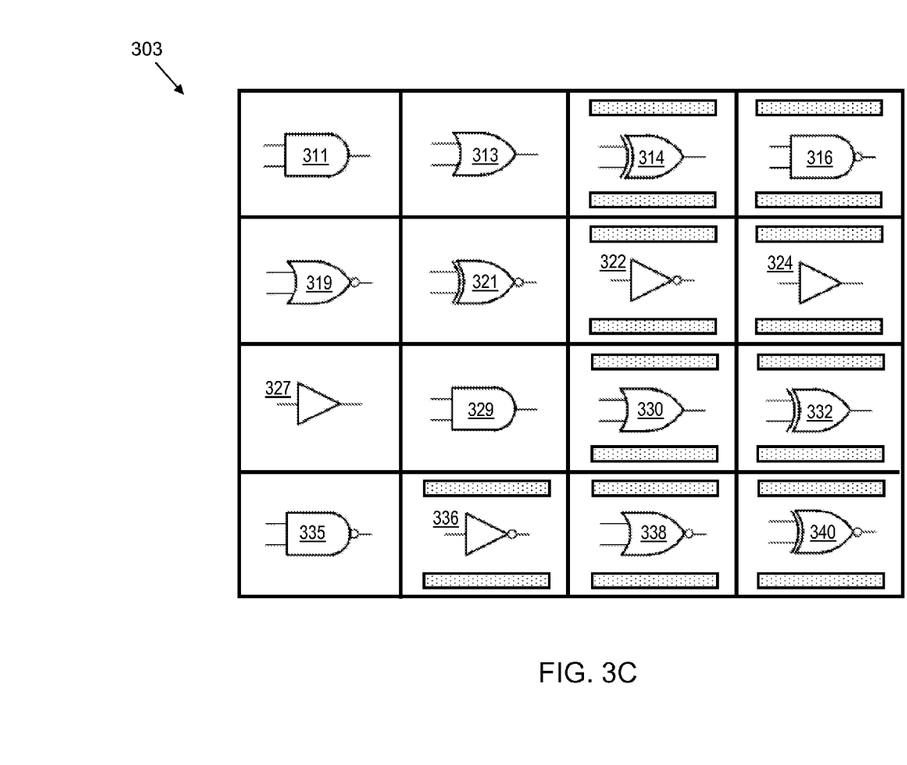
FIG. 3C is a representation of an integrated circuit with a combination of standard cells with and without M2 power rails in accordance with illustrative embodiments.

FIG. 3C is a representation of integrated circuit 303 with a combination of standard cells with and without M2 power rails. The standard cells identified as low current density standard cells in FIG. 3B are replaced with standard cells that are M2 power rail excluding (M2PRE) and, hence, do not have an M2 power rail. As shown in FIG. 3C, cells 311, 313, 319, 321, 327, 329, and 335 are M2PRE standard cells. These cells replace a corresponding M2PR standard cell. For example, cell 313 represents an OR gate M2PRE standard cell, which replaces cell 312 (FIG. 3A). The routing operation is then redone with the replaced M2PRE cells, which gives the router more freedom to route M2 lines in the cases where M2PRE cells are used.

Figure 3D:
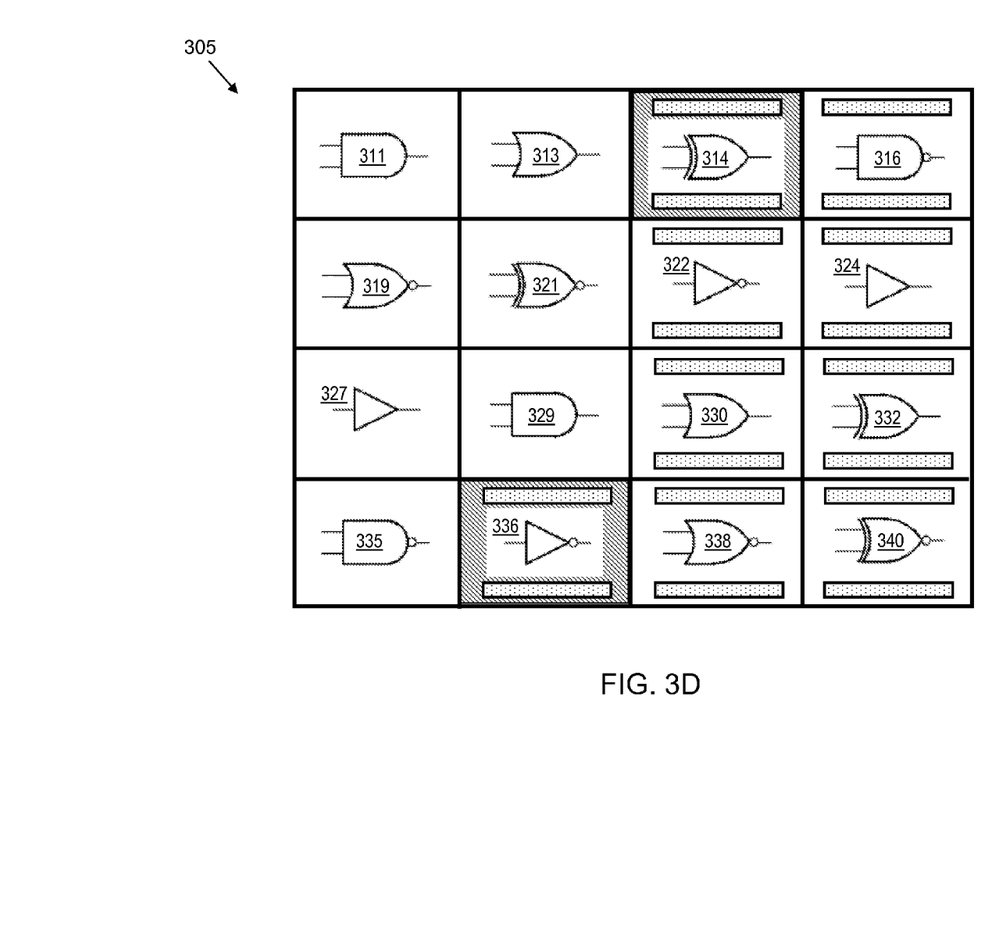
FIG. 3D is a representation of another iteration of a design cycle for an integrated circuit with standard cells identified as low current density cells in accordance with illustrative embodiments.

FIG. 3D is a representation of another iteration of a design cycle for integrated circuit 305 with standard cells identified as low current density cells in accordance with illustrative embodiments. As a result of the second routing operation performed on integrated circuit 303 of FIG. 3C, the power rail current density of additional cells are now below the predetermined threshold. In integrated circuit 305, cells 314 and 336 are now deemed to be low current density standard cells. As a result of subsequent iterations, some of the cells close to the boundary of high/low current density region will may change between M2PR cells and M2PRE cells. Some cells may change back and forth between each type during intermediate iterations. Eventually, the design may converge, where no more cells are changing.

Figure 3E:
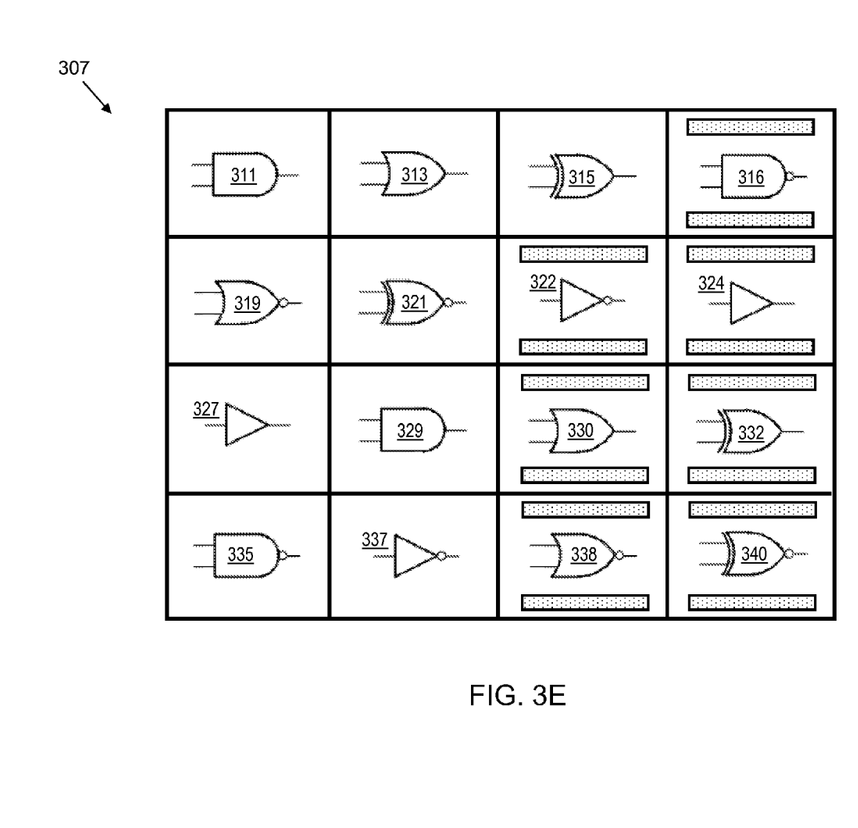
FIG. 3E is a representation of another iteration of a design cycle for an integrated circuit with a combination of standard cells with and without M2 power rails in accordance with illustrative embodiments.

FIG. 3E is a representation of integrated circuit 307 with another combination of standard cells with and without M2 power rails. After a second iteration of routing, standard cells 315 and 337 of the M2PRE type are used in place of cells 314 and 336, respectively, which are of the M2PR type. Ideally, after each iteration, fewer cells need to be replaced, until the design converges, and no additional cell replacements are necessary, at which point the routing is complete, and the integrated circuit comprises a combination of standard cells with (M2PR) and without (M2PRE) M2 power rails. While the aforementioned example involved starting with all M2PR standard cells, and iteratively replacing some of those standard cells with M2PRE cells for cells with power rail current density below a predetermined threshold, other embodiments may work in an opposite manner. Some embodiments may start with all M2PRE cells, and then replace some of those cells with M2PR standard cells for cells with power rail current density above a predetermined threshold. The type of integrated circuit being designed may determine the more appropriate approach. If a design is mostly high power rail current density with a minority number of low power rail current density cells, then starting with M2PR cells may allow the design to converge with less iteration. Conversely, if a design is mostly low power rail current density with a minority number of high power rail current density cells, then starting with M2PRE cells may allow the design to converge with less iteration.

Figure 4:
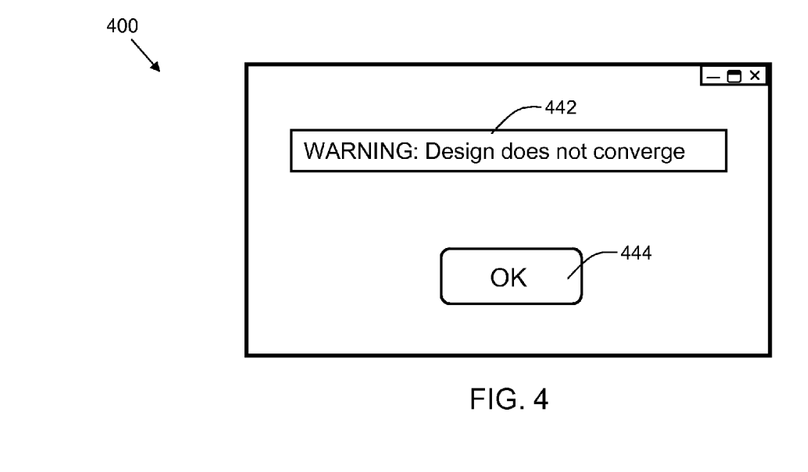
FIG. 4 shows a generated warning message in accordance with illustrative embodiments.

FIG. 4 shows a dialog box 400 with a generated warning message 442 in accordance with illustrative embodiments. In the event that the design does not converge after a predetermined number of iterations, a warning message 442 may be presented to the user. The user can acknowledge the message via the OK button 444, and may then determine whether to accept the design, or perform additional analysis or manipulations to address any design concerns.

Figure 5:
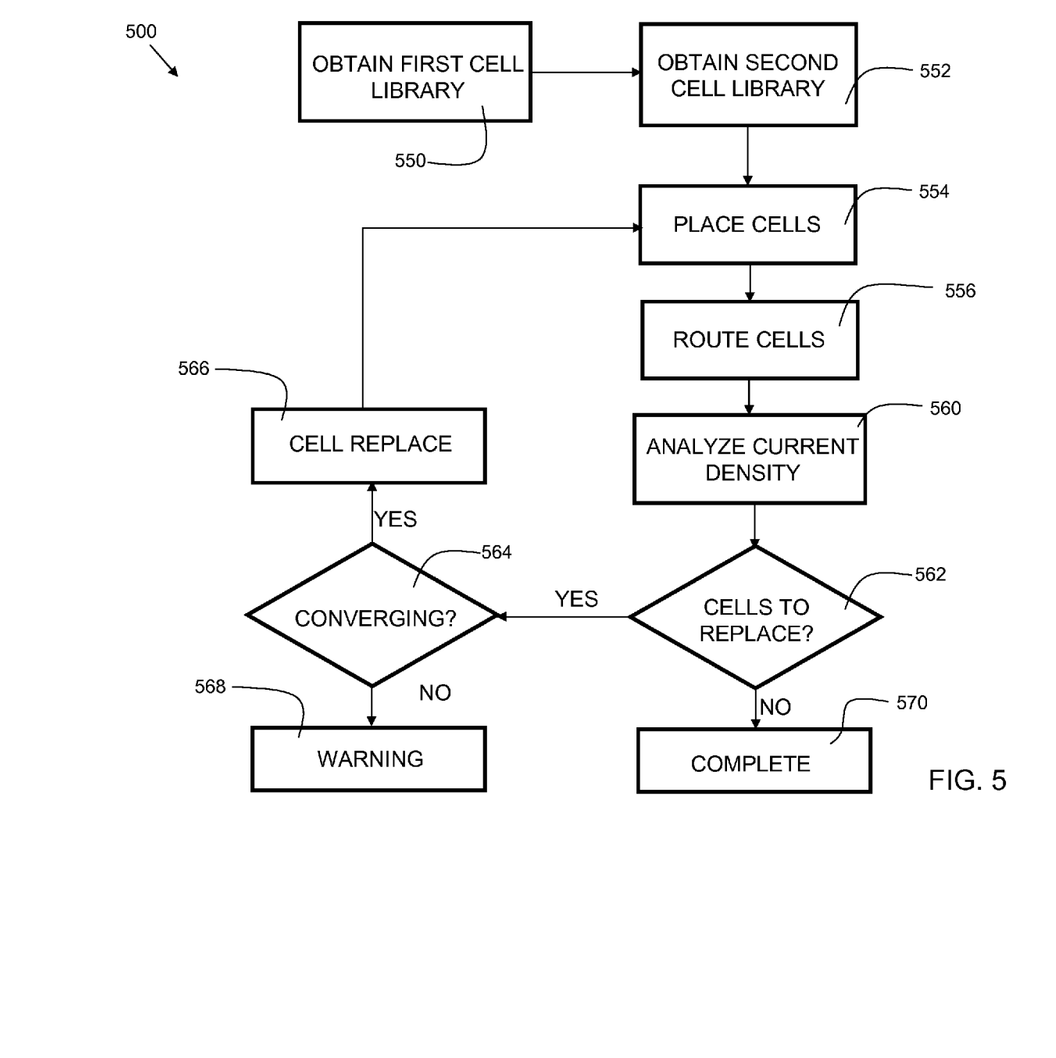
FIG. 5 is a flowchart indicating process steps in accordance with illustrative embodiments.

FIG. 5 is a flowchart 500 indicating process steps in accordance with illustrative embodiments. In process step 550, a first cell library is obtained. The first cell library may be an M2PR type library or an M2PRE type library. In process step 552, a second cell library is obtained. The second cell library is the opposite type of the first cell library. If the first cell library is an M2PR type, then the second cell library is an M2PRE type. Conversely, if the first cell library is an M2PRE type, then the second cell library is an M2PR type. In process step 554, the cells are placed within the integrated circuit design embodiment, such as a design structure or other representation of the integrated circuit design. In process step 556, a routing process is performed to generate interconnections with multiple metal layers. In process step 560, the current density on the power rails of the placed cells is analyzed. A design tool such as HSPICE, Prime Power, PrimeTime, or other suitable tool may be used for this purpose. In process step 562, a check is made to see if any cells should be replaced with the other type of cell. For example, in some embodiments, M2PR cells are replaced with M2PRE cells when the cells have estimated power rail current density below a predetermined value. If cells need replacing, the process continues to process step 564, where a check is made to determine if the design is converging. If the number of cells needing to be replaced is less than in a previous iteration, then the design is converging, and the process continues to process step 566, where the cells are replaced. Process steps 554-562 are repeated. If, at process step 562 there are no additional cells that are identified to replace, then the design is complete at process step 570. If at process step 564, it is determined that the design is not converging, then a warning is generated for a user at process step 568, in response to the non-convergence condition.

Figure 6:
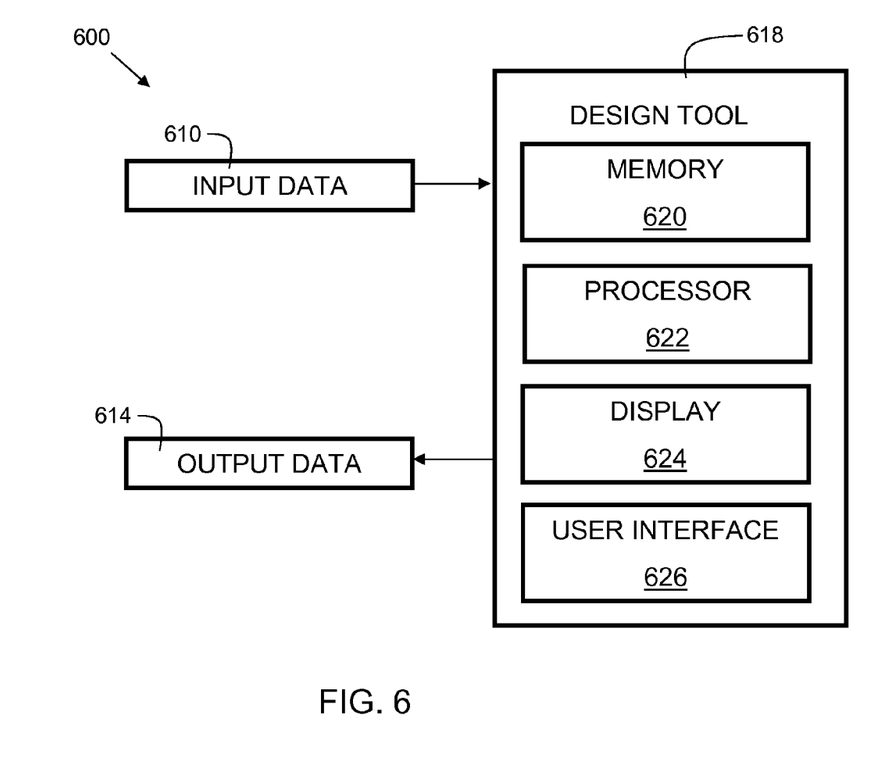
FIG. 6 is a system for implementing illustrative embodiments.

FIG. 6 is a system for implementing illustrative embodiments. System 600 includes a design tool 618. Design tool 618 may be a computer comprising memory 620, and a processor 622 which is coupled to memory 620, such that the processor 622 may be configured to read and write memory 620. In some embodiments, multiple processors or cores may be used. The memory 620 may be a non-transitory computer-readable medium, such as flash, ROM, non-volatile static ram, or other non-transitory memory. The memory 620 contains instructions that, when executed by processor 622, control the various subsystems to operate system 600. Design tool 618 may also include a display 624 and a user interface 626 for interacting with the system 600. The user interface 626 may include a keyboard, touch screen, mouse, or the like.

The design tool 618 may receive input data 610. Input data 610 may include a design structure, which may be a mixed M2 power rail design structure, which includes a combination of standard cells which have M2 power rails (M2PR) and standard cells that do not have M2 power rails (M2PRE). The design structure may be a logical simulation design structure generated and processed by a design process to produce a logically equivalent functional representation of a hardware device. The design structure may also, or alternatively, include data and/or program instructions that when processed by design tool 618, generate a functional representation of the physical structure of a hardware device. The input data 610 may include hardware-description language (HDL) design entities or other data structures conforming to and/or compatible with lower-level HDL design languages such as Verilog and VHDL, and/or higher level design languages such as C, C++, or Python. Embodiments of the present invention may further include a computer program product embodied in a non-transitory computer-readable medium.

The design tool 618 may generate output data 614. The generated output data 614 may be in a stream format indicative of a mixed M2 design structure, which includes a combination of standard cells which have M2 power rails (M2PR) and standard cells that do not have M2 power rails (M2PRE). The output data may reside in a storage medium in a data format used for the exchange of layout data of integrated circuits (e.g. information stored in a GDSII (GDS2), GL1, OASIS, or any other suitable format for storing such design structures). Output data 614 may include information such as, for example, parameterized cells, test data files, design content files, manufacturing data, layout parameters, wires, middle of line (MOL) interconnect information, net lists, levels of metal, vias, shapes, data for routing through the manufacturing line, and any other data required by a semiconductor manufacturer to produce embodiments of the present invention.

In various embodiments, design tools can be provided and configured to create the datasets used to pattern the semiconductor layers as described herein. For example, data sets can be created to generate photomasks used during lithography operations to pattern the layers for structures as described herein. Such design tools can include a collection of one or more modules and can also include hardware, software, or a combination thereof. Thus, for example, a tool can be a collection of one or more software modules, hardware modules, software/hardware modules, or any combination or permutation thereof. As another example, a tool can be a computing device or other appliance on which software runs or in which hardware is implemented. As used herein, a module might be implemented utilizing any form of hardware, software, or a combination thereof. For example, one or more processors, controllers, application-specific integrated circuits (ASIC), programmable logic arrays (PLA)s, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A method for designing an integrated circuit, comprising:
    obtaining a first standard cell library;
    obtaining a second standard cell library, wherein the first standard cell library and second standard cell library are logically equivalent, and wherein one of the first standard cell library and second standard cell library are of an M2PR type and another of the first standard cell library and second standard cell library are of an M2PRE type;
    placing cells from the first standard cell library in an integrated circuit design embodiment;
    performing a first routing using the placed cells from the first standard cell library;
    identifying standard cells for replacement;
    replacing the identified standard cells with standard cells from the second standard cell library; and
    performing a second routing using the placed cells from both the first standard cell library and second standard cell library.

2. The method of claim 1, wherein:
    the first standard cell library is of an M2PR type;
    the second standard cell library is of an M2PRE type; and
    identifying standard cells for replacement comprises identifying standard cells having a power rail current density below a predetermined threshold.

3. The method of claim 1, wherein:
    the first standard cell library is of an M2PRE type;
    the second standard cell library is of an M2PR2 type; and
    identifying standard cells for replacement comprises identifying standard cells having a power rail current density above a predetermined threshold.

4. The method of claim 2, wherein identifying standard cells having a current density below a predetermined threshold comprises identifying standard cells having a power rail current density below about $5 \times 10^6$ amperes per square centimeter.

5. The method of claim 1, further comprising repeating the steps of:
    identifying standard cells for replacement;
    replacing the identified cells with cells from the second standard cell library; and
    performing another routing using the placed cells from both the first standard cell library and second standard cell library.

6. The method of claim 5, further comprising generating a user warning in response to a non-convergence condition.

7. The method of claim 1, wherein the first standard cell library and second standard cell library comprise standard cells selected from the group consisting of: NOT, NAND, NOR, XOR, AND, OR, and buffer.

8. A system for designing an integrated circuit, comprising one or more processors coupled to non-transitory memory containing machine instructions, that when executed by the one or more processors, perform the functions of:
    obtaining a first standard cell library;
    obtaining a second standard cell library, wherein the first standard cell library and second standard cell library are logically equivalent, and wherein one of the first standard cell library and second standard cell library are of an M2PR type and another of the first standard cell library and second standard cell library are of an M2PRE type;
    placing cells from the first standard cell library in an integrated circuit design embodiment;
    performing a first routing using the placed cells from the first standard cell library;
    identifying standard cells for replacement;
    replacing the identified standard cells with standard cells from the second standard cell library; and
    performing a second routing using the placed cells from both the first standard cell library and second standard cell library.

9. The system of claim 8, wherein the non-transitory memory further comprises instructions that, when executed by the one or more processors, perform functions of:
    obtaining a first standard cell library of an M2PR type;
    obtaining a second standard cell library of an M2PRE type; and
    identifying standard cells having a power rail current density below a predetermined threshold.

10. The system of claim 8, wherein the non-transitory memory further comprises instructions that, when executed by the one or more processors, perform functions of:
    obtaining a first standard cell library of an M2PRE type;
    obtaining a second standard cell library of an M2PR type; and
    identifying standard cells having a power rail current density above a predetermined threshold.

11. The system of claim 9, wherein the non-transitory memory further comprises instructions that, when executed by the one or more processors, perform a function of identifying standard cells having a power rail current density below about $5\times10^6$ amperes per square centimeter.

12. The system of claim 8, wherein the non-transitory memory further comprises instructions that, when executed by the one or more processors, perform functions of repeating the steps of:
    identifying standard cells for replacement;
    replacing the identified standard cells with standard cells from the second cell library; and
    performing another routing using the placed cells from both the first standard cell library and second standard cell library.

13. The system of claim 12, wherein the non-transitory memory further comprises instructions that, when executed by the one or more processors, perform a function of generating a user warning in response to a non-convergence condition.

14. A computer program product embodied in a non-transitory computer-readable medium for designing an integrated circuit, comprising:
    instructions for obtaining a first standard cell library;
    instructions for obtaining a second standard cell library, wherein the first standard cell library and second standard cell library are logically equivalent, and wherein one of the first standard cell library and second standard cell library are of an M2PR type and another of the first standard cell library and second standard cell library are of an M2PRE type;
    instructions for placing cells from the first standard cell library in an integrated circuit design embodiment;
    instructions for performing a first routing using the placed cells from the first standard cell library;
    instructions for identifying standard cells for replacement;
    instructions for replacing the identified cells with cells from the second cell library; and
    instructions for performing a second routing using the placed cells from both the first standard cell library and second standard cell library.

15. The computer program product of claim 14, further comprising instructions for:
    obtaining a first standard cell library of an M2PR type;
    obtaining a second standard cell library of an M2PRE type; and
    identifying standard cells having a power rail current density below a predetermined threshold.

16. The computer program product of claim 14, further comprising instructions for:
    obtaining a first standard cell library of an M2PRE type;
    obtaining a second standard cell library of an M2PR type; and
    identifying standard cells having a power rail current density above a predetermined threshold.

17. The computer program product of claim 15, further comprising instructions for identifying standard cells having a power rail current density below about $5\times10^6$ amperes per square centimeter.

18. The computer program product of claim 16, further comprising instructions for identifying standard cells having a power rail current density above about $5\times10^6$ amperes per square centimeter.

19. The computer program product of claim 14, further comprising instructions for repeating the steps of:
    identifying standard cells for replacement;
    replacing the identified cells with cells from the second standard cell library; and
    performing another routing using the placed cells from both the first standard cell library and second standard cell library.

20. The computer program product of claim 14, further comprising instructions for generating a user warning in response to a non-convergence condition.

* * * * *